(12) United States Patent
Yoshida et al.

(10) Patent No.: US 8,415,762 B2
(45) Date of Patent: Apr. 9, 2013

(54) SEMICONDUCTOR DEVICE FOR PERFORMING PHOTOELECTRIC CONVERSION

(75) Inventors: Yoshinori Yoshida, Fussa (JP); Tatsuya Tominari, Tachikawa (JP); Toshio Ando, Kunitachi (JP)

(73) Assignee: Hitachi, Ltd., Tokyo (JP)

(*) Notice: Subject to any disclaimer, the term of this patent is extended or adjusted under 35 U.S.C. 154(b) by 1242 days.

(21) Appl. No.: 11/933,195

(22) Filed: Oct. 31, 2007

(65) Prior Publication Data

US 2008/0099788 A1  May 1, 2008

(30) Foreign Application Priority Data

Oct. 31, 2006  (JP) ................. 2006-296499

(51) Int. Cl.
 *H01L 21/331* (2006.01)
 *H01L 29/737* (2006.01)

(52) U.S. Cl.
 USPC ............ 257/565; 257/197; 257/E21.371; 257/E21.696; 257/E29.188; 438/312

(58) Field of Classification Search .......... 257/197, 257/E21.371, E21.696, E29.188
 See application file for complete search history.

(56) References Cited

U.S. PATENT DOCUMENTS

| 6,049,098 A * | 4/2000 | Sato ............... 257/198 |
| 6,362,066 B1 | 3/2002 | Ryum et al. |
| 6,838,349 B2 | 1/2005 | Yamauchi |
| 2002/0158311 A1 * | 10/2002 | Ohnishi et al. ........ 257/591 |
| 2003/0157774 A1 * | 8/2003 | Tominari et al. ....... 438/312 |

FOREIGN PATENT DOCUMENTS

| JP | 2000-124222 A | 4/2000 |
| JP | 2001-085446 A | 3/2001 |
| JP | 2003-045884 A | 2/2003 |

* cited by examiner

*Primary Examiner* — Lynne Gurley
*Assistant Examiner* — Vernon P Webb
(74) *Attorney, Agent, or Firm* — Miles & Stockbridge P.C.

(57) ABSTRACT

The external base electrode has a two-layered structure where a p-type polysilicon film doped with a medium concentration of boron is laminated on a p-type polysilicon film doped with a high concentration of boron. Therefore, since the p-type polysilicon film doped with a high concentration of boron is in contact with an intrinsic base layer at a junction portion between the external base electrode and the intrinsic base layer, the resistance of the junction portion can be reduced. In addition, since the resistance of the external base electrode becomes a parallel resistance of the two layers of the p-type polysilicon films, the resistance of the p-type polysilicon film whose boron concentration is relatively lower is dominant.

13 Claims, 19 Drawing Sheets

SEMICONDUCTOR DEVICE FOR PERFORMING PHOTOELECTRIC CONVERSION

CROSS-REFERENCE TO RELATED APPLICATION

The present application claims priority from Japanese Patent Application No. JP 2006-296499 filed on Oct. 31, 2006, the content of which is hereby incorporated by reference into this application.

TECHNICAL FIELD OF THE INVENTION

The present invention relates to a semiconductor device and a manufacturing technique for the same. More particularly, it relates to a technique effectively applied to a semiconductor device having a bipolar transistor and a manufacture thereof.

BACKGROUND OF THE INVENTION

As an ultra high speed communication device suitable for an application such as a cellular phone and optical communication, the development of a heterojunction bipolar transistor (HBT) using a heterojunction material such as SiGe (Silicon-Germanium) and GaAs (Gallium-Arsenic) has proceeded.

Japanese Patent Application Laid-open publication No. 2001-85446 (Patent Document 1) discloses an HBT in which a laminating film including a silicon film and an SiGe film is used as a base layer and a metal silicide is adopted to a base ohmic layer, thereby reducing the resistance of an external base electrode.

The base layer mentioned above is formed of a laminating film which comprises a seed layer made of a silicon film, an SiGe layer added with no dopant, a $p^+$-type SiGe layer, and a silicon layer added with no dopant. The external base electrode comprises a first external base electrode obtained by doping a high concentration of boron into a laminating film made of the same materials as those of the base layer and a second external base electrode which is selectively grown on the first external base electrode. The second external base electrode includes at least one of a silicon film, an SiGe layer, and a Ge layer, and is doped with boron. A base ohmic layer made of a metal silicide film is formed on the second external base electrode in order to reduce the resistance of the external base electrode.

Japanese Patent Application Laid-open publication No. 2000-124222 (Patent Document 2) discloses an HBT in which a high frequency characteristic is improved by reducing the resistance and the parasitic capacitance of a base region. This HBT comprises a base region made of a boron doped SiGe epitaxial layer formed on the surface of a collector region and an external base electrode made of a boron doped polysilicon film. The base region is electrically connected to the external base electrode through a second boron doped polysilicon film and a third polysilicon film. The third polysilicon film contains boron in high concentration which diffuses from the second boron doped polysilicon film and the external base electrode. In this structure, since the distance between the external base electrode and the collector region becomes large, the parasitic capacitance of the base region can be reduced. In addition, since dopant concentration in the third polysilicon film becomes high, the resistance of the base region can be reduced.

Japanese Patent Application Laid-open publication No. 2003-45884 (Patent Document 3) discloses an HBT in which a high concentration of boron is ion-implanted into the connection portion between a base layer and an external base electrode in order to suppress a parasitic resistance between the base layer and the external base electrode, thereby achieving high speed and lower noise.

SUMMARY OF THE INVENTION

The inventors of the present invention have been developing a heterojunction bipolar transistor (HBT), and the HBT comprises an n-type collector layer formed on a main surface of a single-crystal silicon substrate, a base layer made of a boron doped SiGe epitaxial film formed on the n-type collector layer, and an emitter layer formed on a part of the surface of the base layer.

The emitter layer is formed by diffusing phosphorus from an external emitter electrode made of an n-type polysilicon film formed on the base layer to a part of the surface of the base layer. One end of an external base electrode which is separated by an insulating film from the external emitter electrode is connected to the other part of the surface of the base layer.

The external base electrode comprises a boron doped p-type polysilicon film. When doping boron into the polysilicon film constituting the external base electrode, after a non-doped polysilicon film which does not contain any boron is deposited by a chemical vapor deposition (CVD) method, boron is doped by ion-implantation technique, or boron is doped during the formation of the polysilicon film (in-situ doping).

A reduction in the base resistance is an important subject in terms of an improvement on high speed performance of the above-mentioned HBT. In the above-mentioned HBT, the elements constituting the base resistance are divided into the resistance of the base layer, the resistance of the external base electrode, and the resistance of a connecting portion (junction portion) between the base layer and the external base electrode. Therefore, in order to reduce the base resistance, it is effective to increase both the boron concentration in an SiGe epitaxial film constituting the base layer and that in a polysilicon film constituting the external base electrode, respectively.

However, for the reasons described below, it is difficult in the conventional manufacturing technique to reduce both the resistance of the above-described external base electrode and that of the junction portion at the same time.

First, in a case where an external base electrode is formed by doping boron into a non-doped polysilicon film which contains no boron, a boron concentration gradient exists in a direction of the film thickness of the polysilicon film, and a boron concentration at the bottom of the film becomes lower than that of the film surface. Accordingly, in a method of doping boron by an ion-implantation technique, it is difficult to increase a boron concentration in the vicinity of the junction portion between the external base electrode and the base layer. Therefore, although the resistance of the external base electrode can be reduced, it is difficult to reduce the resistance of the junction portion.

Meanwhile, in a case where a method of doping boron during the formation of the film is adopted, a boron concentration can be made uniform across a thickness direction of the polysilicon film. Therefore, a boron concentration in the vicinity of the junction portion between the external base electrode and the base layer can be increased. However, when a polysilicon film is doped with a high concentration of boron which can sufficiently reduce the resistance of the junction portion, the resistance of the external base electrode adversely increases.

FIG. 19 is a graph showing the result of the experiment (Haji et al. J. Appl. Phys., Vol. 66, No. 10, 15 Nov. 1989) on the measurement of the relationship between the resistivity of a boron doped polysilicon film and the boron concentration in the film. According to the result of the experiment, in the range from a low boron concentration to a medium boron concentration (about from $1 \times 10^{21}$ atoms/cm$^3$ to $2 \times 10^{21}$ atoms/cm$^3$), the resistivity is decreased as the boron concentration is increased. By contrast, in the range of a high boron concentration of $2 \times 10^{21}$ atoms/cm$^3$ or more, the resistivity is increased as the boron concentration is increased.

In other words, when a high concentration of boron ($2 \times 10^{21}$ atoms/cm$^3$ or more) is doped into a polysilicon film in order to reduce the resistance of the junction portion, the resistance of the external electrode is increased. Meanwhile, when a medium concentration of boron (about from $1 \times 10^{21}$ atoms/cm$^3$ to $2 \times 10^{21}$ atoms/cm$^3$) is doped into a polysilicon film in order to reduce the resistance of the external base electrode, the resistance of the junction portion cannot be sufficiently reduced.

An object of the present invention is to provide a technique for reducing a base resistance of a bipolar transistor including an external base electrode constituted of a boron doped polysilicon film.

The above and other objects and novel characteristics of the present invention will be apparent from the description of this specification and the accompanying drawings.

The typical ones of the inventions disclosed in this application will be briefly described as follows.

A semiconductor device according to the present invention has a bipolar transistor which comprises: an n-type collector layer formed on a main surface of a semiconductor substrate; a p-type base layer formed on the n-type collector layer; an external base electrode connected to the p-type base layer; and an n-type emitter layer, wherein the external base electrode has a multilayered structure in which a second silicon film having a second boron concentration is laminated on a first silicon film having a first boron concentration, and the second boron concentration is lower than the first boron concentration, and the external base electrode and the p-type base layer are disposed so that the first silicon layer is in contact with the p-type base layer.

A method for manufacturing a semiconductor device according to the present invention comprises the steps of:

(a) forming an n-type collector layer on a main surface of a semiconductor substrate;

(b) forming a p-type base layer on the n-type collector layer;

(c) after the step (b), forming a first silicon film having a first boron concentration over the main surface of the semiconductor substrate, and laminating a second silicon film having a second boron concentration which is lower than the first boron concentration on the first silicon film; and (d) patterning the first and second silicon films, thereby forming an external base electrode including the first and second silicon films and having a part of the first silicon film being in contact with the p-type base layer.

The effects obtained by typical aspects of the present invention will be briefly described below.

Since both the resistance of the junction portion between an external base electrode and a base layer and the resistance of the external base electrode can be reduced at the same time, the base resistance can be decreased, and therefore, a high speed performance of a bipolar transistor can be improved.

BRIEF DESCRIPTION OF THE DRAWINGS

FIG. 14 is a cross-sectional view of a principal part of a semiconductor substrate showing a method for manufacturing a semiconductor device continued from FIG. 13;

DESCRIPTION OF THE PREFERRED EMBODIMENT

Figure 1:
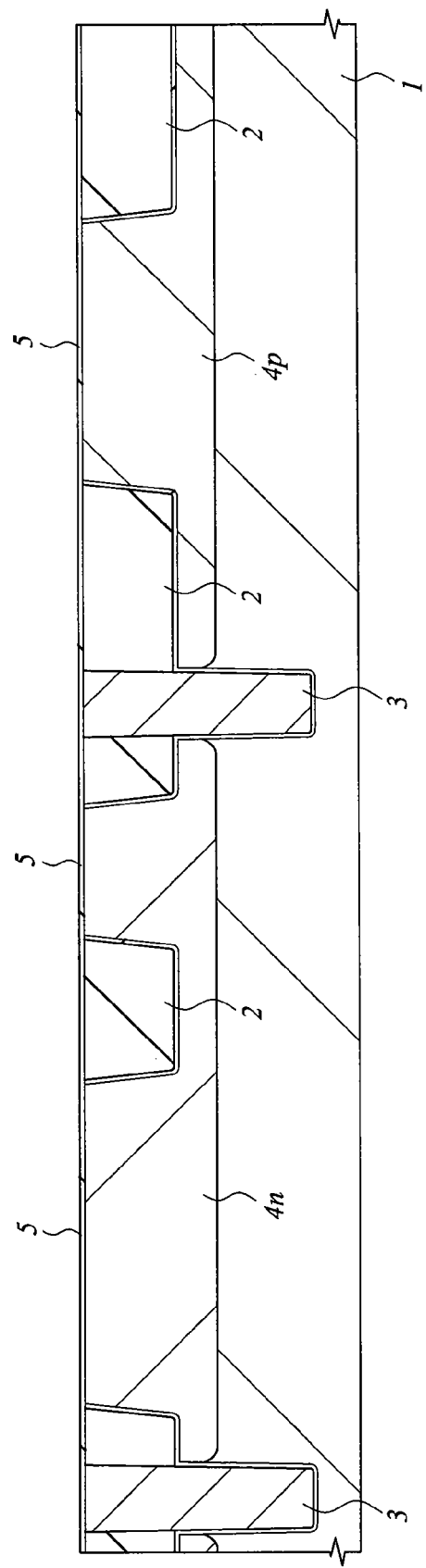
FIG. 1 is a cross-sectional view of a principal part of a semiconductor substrate showing a method for manufacturing a semiconductor device according to an embodiment of the present invention.

Hereinafter, embodiments of the present invention will be described in detail with reference to the accompanying drawings. Note that components having the same function are denoted by the same reference numerals throughout the drawings for describing the embodiment, and the repetitive description thereof will be omitted.

The present embodiments are applied to a semiconductor device having both a heterojunction bipolar transistor (HBT) using an SiGe and a complementary metal-oxide semiconductor field-effect transistor (CMOSFET). A manufacturing method thereof will be described in an order of process steps with reference to FIG. 1 to FIG. 15. Note that, since a main feature of the present embodiment lies in an HBT, only a manufacturing method for an n-channel type MOS transistor (hereinafter, simply referred as nMOS transistor) is described with regard to the CMOSFET, and the description of a manufacturing method for a p-channel type MOSFET is omitted.

First, as shown in FIG. 1, shallow trench isolations 2 and deep trench isolations 3 are formed in a main surface of a semiconductor substrate made of single-crystal silicon (hereinafter, simply referred as a substrate) by a conventional method. Then, phosphorus is ion-implanted into an HBT formation region of the substrate 1 to form an n-type collector layer 4$n$, and boron is ion-implanted into an nMOS transistor formation region of the substrate 1 to form a p-type well 4$p$. Thereafter, a gate insulator 5 made of a silicon oxynitride film and the like is formed on each surface of the n-type collector layer 4$n$ and the p-type well 4$p$.

Figure 2:
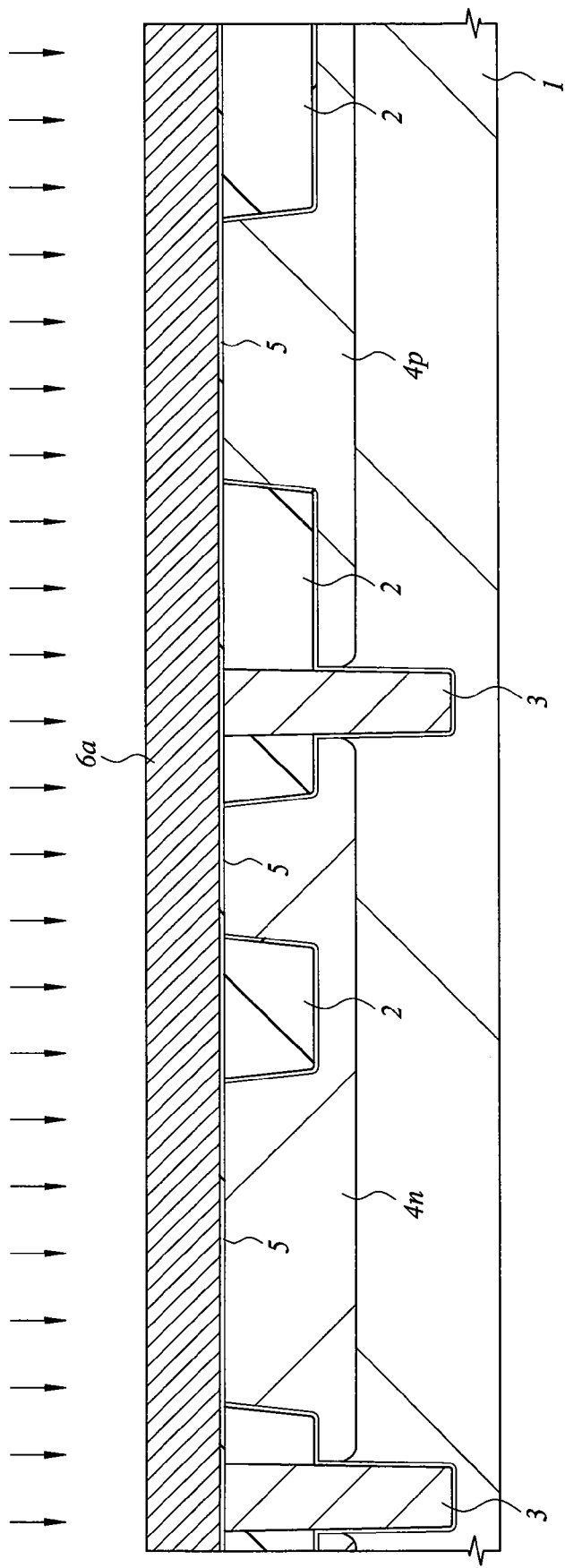
FIG. 2 is a cross-sectional view of a principal part of a semiconductor substrate showing a method for manufacturing a semiconductor device continued from FIG. 1.
Figure 3:
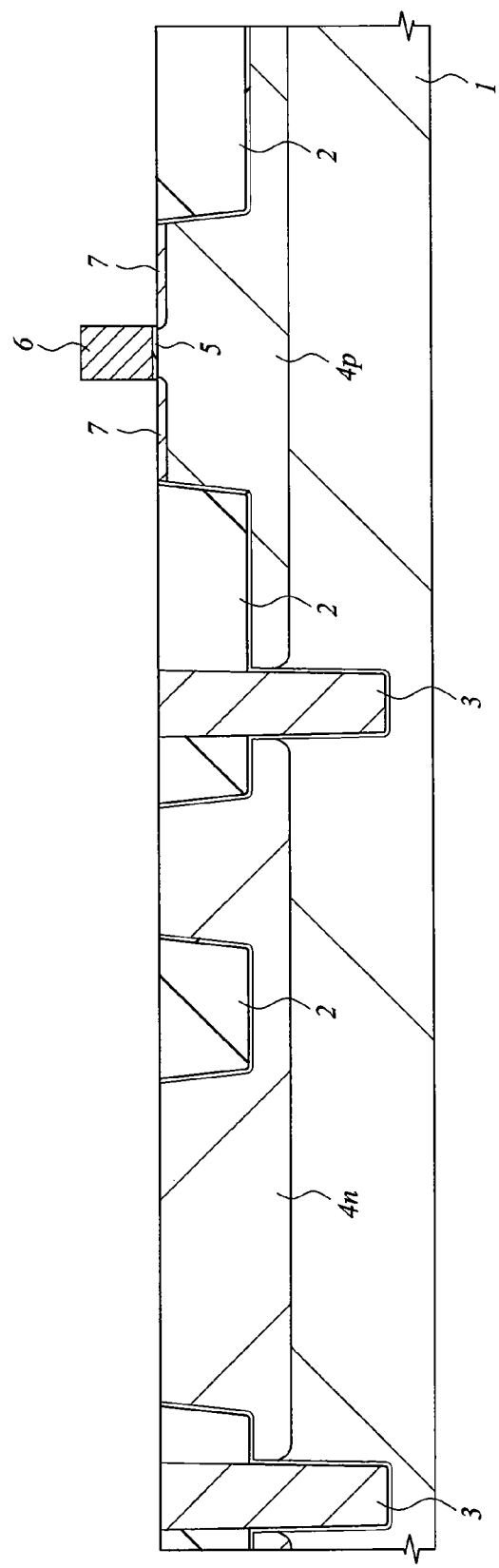
FIG. 3 is a cross-sectional view of a principal part of a semiconductor substrate showing a method for manufacturing a semiconductor device continued from FIG. 2.

Next, as shown in FIG. 2, after a polysilicon film 6$a$ is deposited over the substrate 1 by a chemical vapor deposition (CVD) method, phosphorous is ion-implanted into the polysilicon film 6$a$ so as to change the conductive type thereof into n-type. Then, as shown in FIG. 3, dry etching is performed to the polysilicon film 6$a$ so as to form a gate electrode 6 on the gate insulator 5 of the nMOS transistor formation region. Subsequently, phosphorous is ion-implanted into the p-type well 4$p$, thereby forming an $n^-$-type extension region 7.

Figure 4:
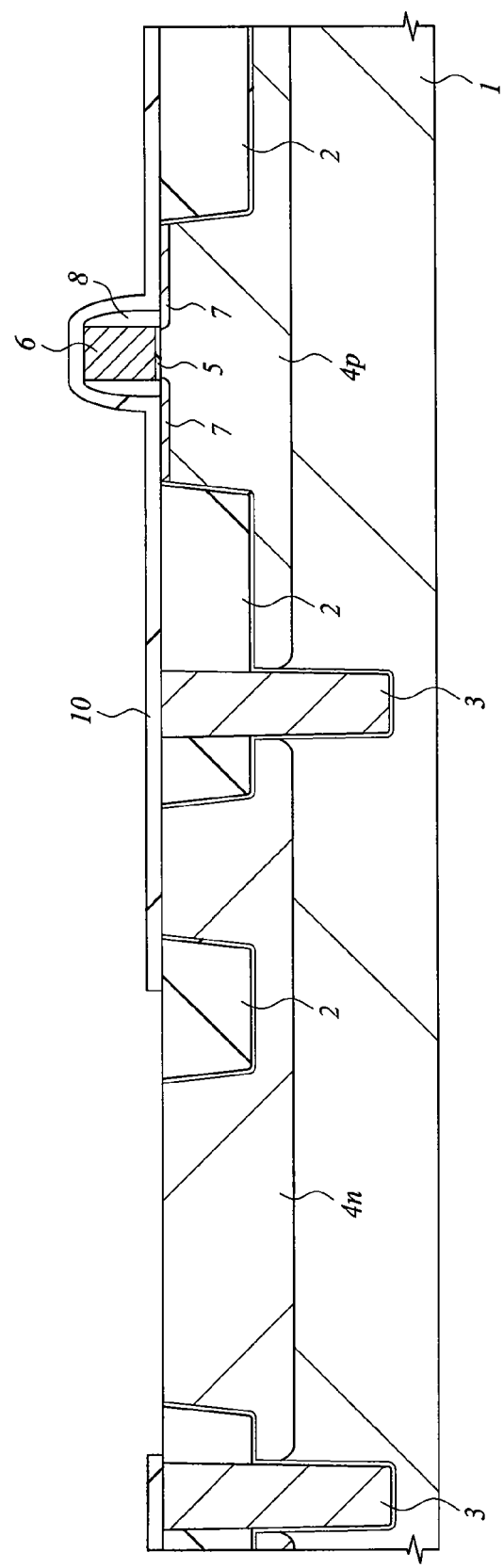
FIG. 4 is a cross-sectional view of a principal part of a semiconductor substrate showing a method for manufacturing a semiconductor device continued from FIG. 3.

Next, as shown in FIG. 4, the anisotropic dry etching is performed to a silicon nitride film deposited over the substrate 1 by a CVD method, thereby forming side wall spacers on the side walls of the gate electrode 6. Then, after a silicon dioxide film 10 is deposited over the substrate 1 by a CVD method, the silicon dioxide film 10 in the HBT formation region is removed by wet etching. This silicon dioxide film 10 is formed in order to protect the MOS transistor formation region in the subsequent process step for manufacturing the HBT.

Figure 5:
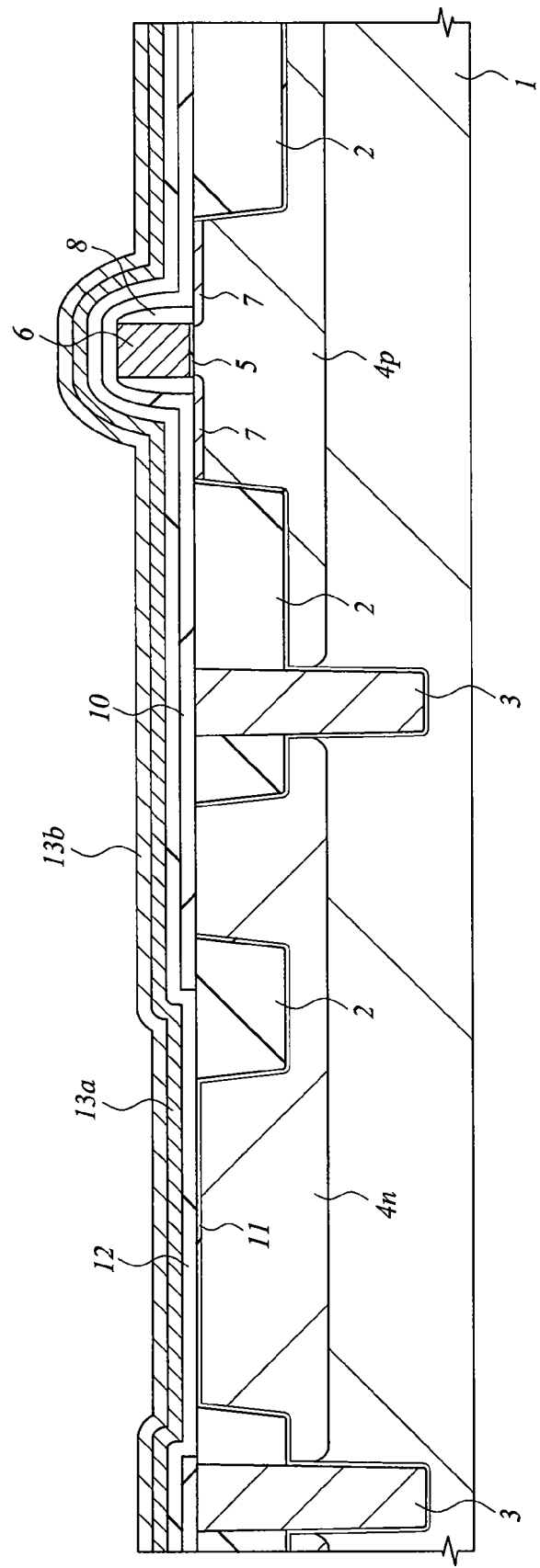
FIG. 5 is a cross-sectional view of a principal part of a semiconductor substrate showing a method for manufacturing a semiconductor device continued from FIG. 4.

Next, as shown in FIG. 5, by performing a thermal oxidation to the substrate 1, a thin silicon dioxide film 11 is formed on the surface of the n-type collector layer 4$n$. Thereafter, a silicon nitride film 12 is deposited over the substrate 1 by a CVD method. Subsequently, two layers such as p-type polysilicon films 13$a$ and 13$b$ are deposited on the silicon nitride film 12 by a CVD method. The p-type polysilicon films 13$a$ and 13$b$ serve as conductive films for the external base electrode, wherein the p-type polysilicon film 13$a$ as a first layer is doped with a high concentration of boron ($2 \times 10^{21}$ atoms/cm$^3$ or more) during the formation of the film (in-situ doping) and the p-type polysilicon film 13$b$ as a second layer is doped with a medium concentration of boron (from $1 \times 10^{21}$ atoms/cm$^3$ to less than $2 \times 10^{21}$ atoms/cm$^3$) during the formation of the film.

Alternatively, the p-type polysilicon films 13$a$ and 13$b$ can be formed by depositing an amorphous silicon film doped with a medium concentration of boron (from $1 \times 10^{21}$ atoms/cm$^3$ to less than $2 \times 10^{21}$ atoms/cm$^3$) on an amorphous silicon film doped with a high concentration of boron ($2 \times 10^{21}$ atoms/cm$^3$ or more), and then crystallizing the two amorphous silicon films in the following annealing process.

Figure 6:
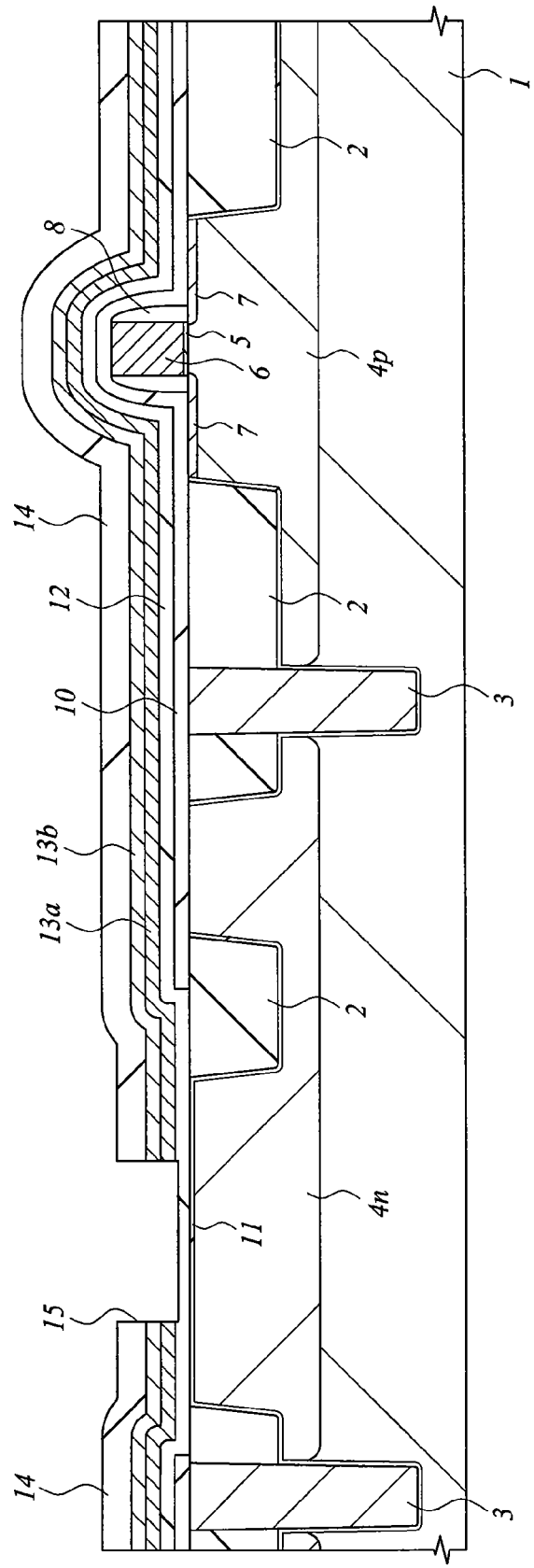
FIG. 6 is a cross-sectional view of a principal part of a semiconductor substrate showing a method for manufacturing a semiconductor device continued from FIG. 5.

Next, as shown in FIG. 6, after a silicon dioxide film 14 is deposited on the p-type polysilicon film 13$b$ by, for example, a high density plasma chemical vapor deposition method, an emitter opening 15 is formed by dry-etching the silicon dioxide film 14 and the p-type polysilicon films 13$a$ and 13$b$ in the HBT formation region.

Figure 7:
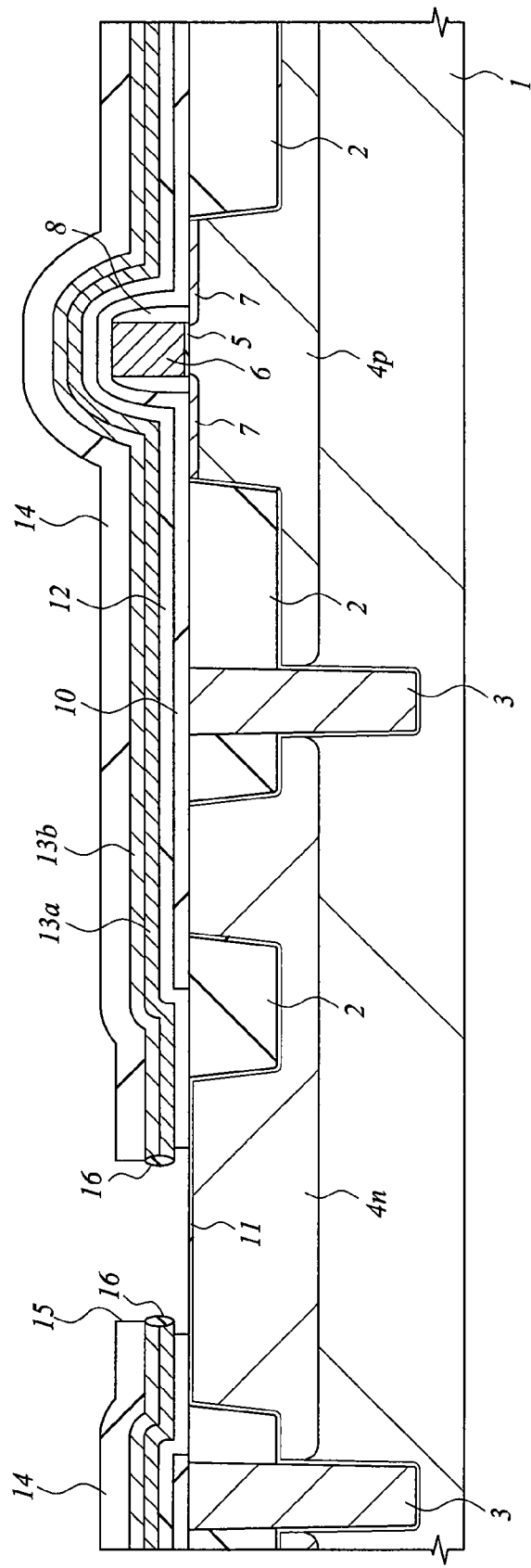
FIG. 7 is a cross-sectional view of a principal part of a semiconductor substrate showing a method for manufacturing a semiconductor device continued from FIG. 6.

Next, as shown in FIG. 7, by performing a thermal oxidation to the substrate 1, a silicon dioxide film 16 is formed on the surfaces of the p-type polysilicon films 13$a$ and 13$b$, which are exposed on the side walls of the emitter opening 15. Then, the silicon nitride film 12 at the bottom of the emitter opening 15 is removed by wet etching using hot phosphoric acid, whereby the end potion of the silicon nitride film 12 remaining on the inner periphery of the emitter opening 15 is recessed outwardly relative to the end portion of the p-type polysilicon film 13$a$.

Figure 8:
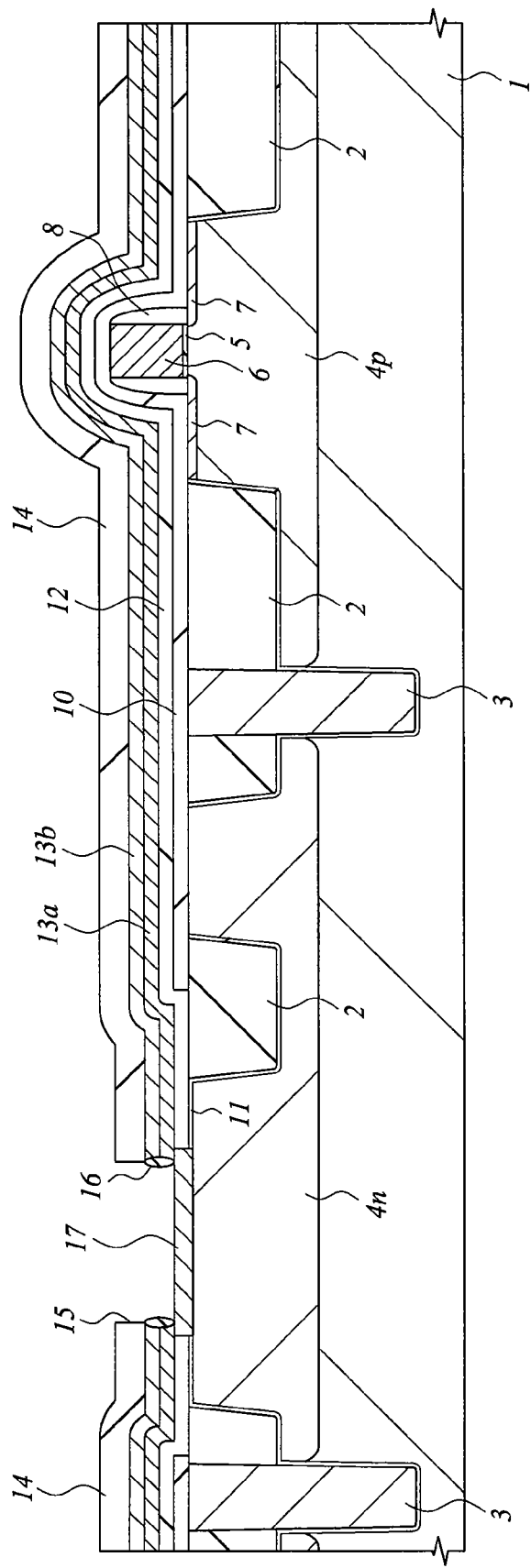
FIG. 8 is a cross-sectional view of a principal part of a semiconductor substrate showing a method for manufacturing a semiconductor device continued from FIG. 7.

Next, as shown in FIG. 8, the silicon dioxide film 11 at the bottom of the emitter opening 15 is removed by wet etching using diluted hydrofluoric acid. Then, a boron doped SiGe epitaxial film 17 is deposited using a selective epitaxial growth by a reduced pressure chemical vapor deposition method on the surface of the n-type collector layer 4$n$, which is exposed at the bottom of the emitter opening 15. This boron doped SiGe epitaxial film 17 is a conductive film that functions as an intrinsic base layer of the HBT. At this time, the outer peripheral portion of the boron doped SiGe epitaxial film 17 contacts with the end portion of the p-type polysilicon layer 13$a$ doped with high-concentration boron.

Figure 9:
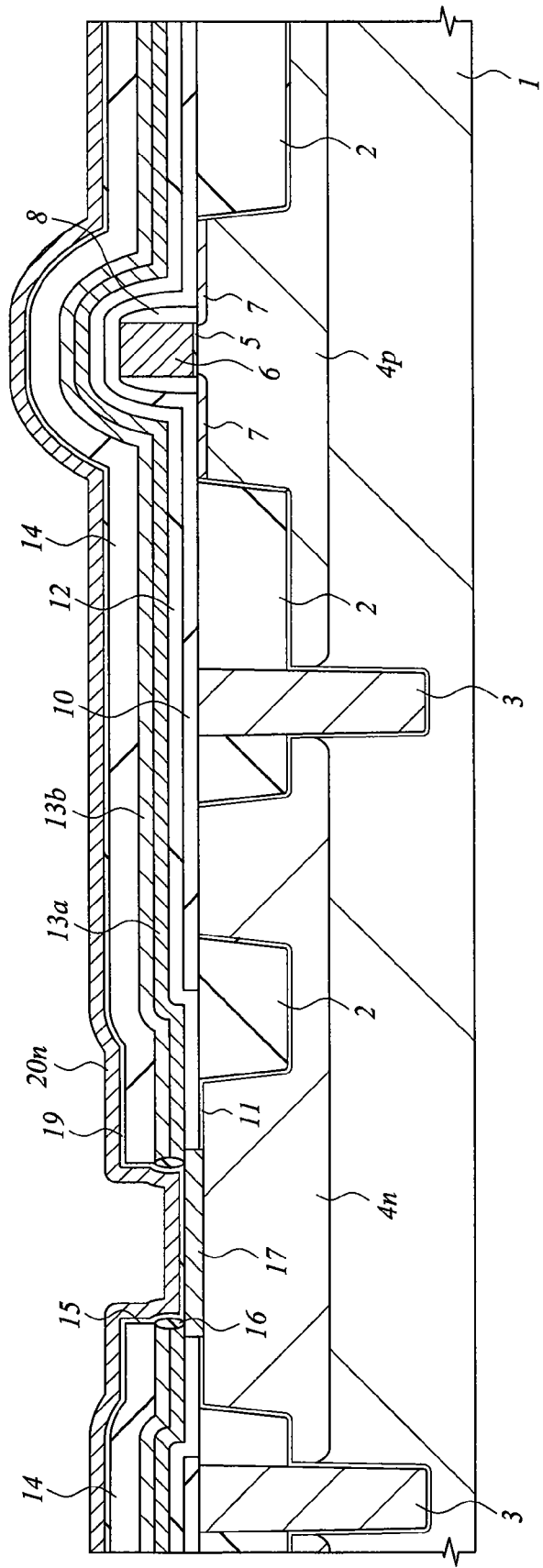
FIG. 9 is a cross-sectional view of a principal part of a semiconductor substrate showing a method for manufacturing a semiconductor device continued from FIG. 8.

Next, as shown in FIG. 9, after a silicon dioxide film 19 is deposited over the substrate 1 by a CVD method, an n-type polysilicon film 20$n$ is deposited on the silicon dioxide film 19 by a CVD method. Phosphorus is doped into the n-type polysilicon film 20$n$ during the formation thereof.

Figure 10:
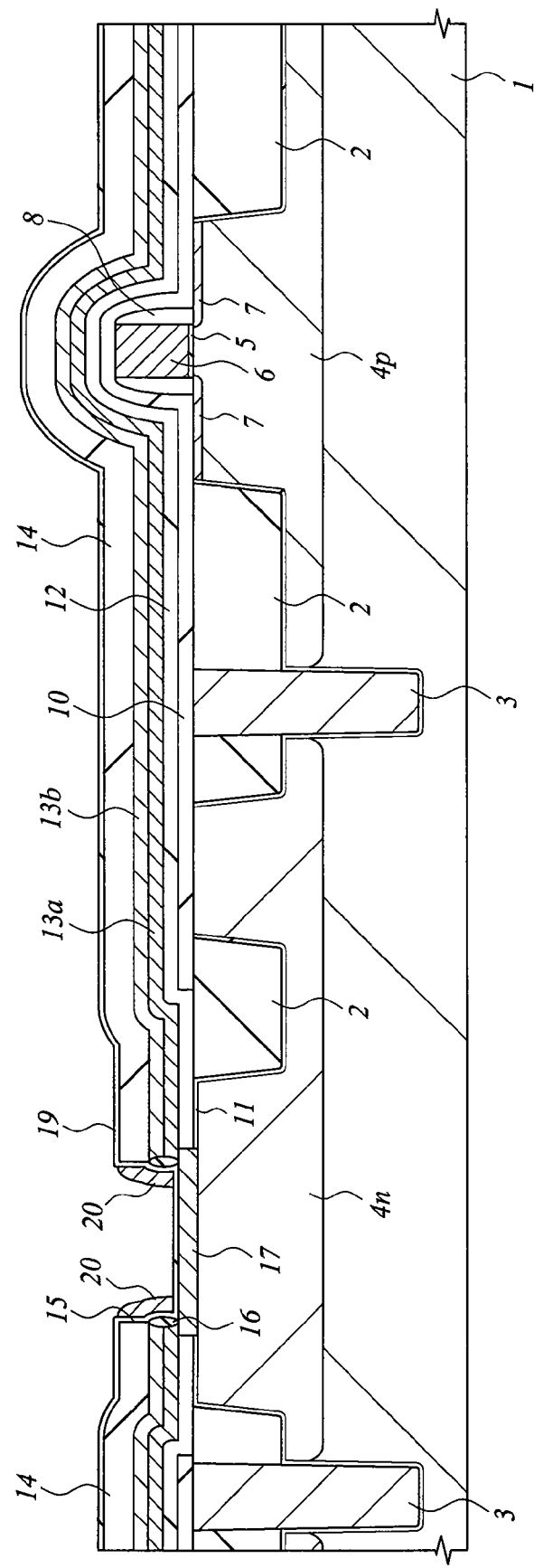
FIG. 10 is a cross-sectional view of a principal part of a semiconductor substrate showing a method for manufacturing a semiconductor device continued from FIG. 9.
Figure 11:
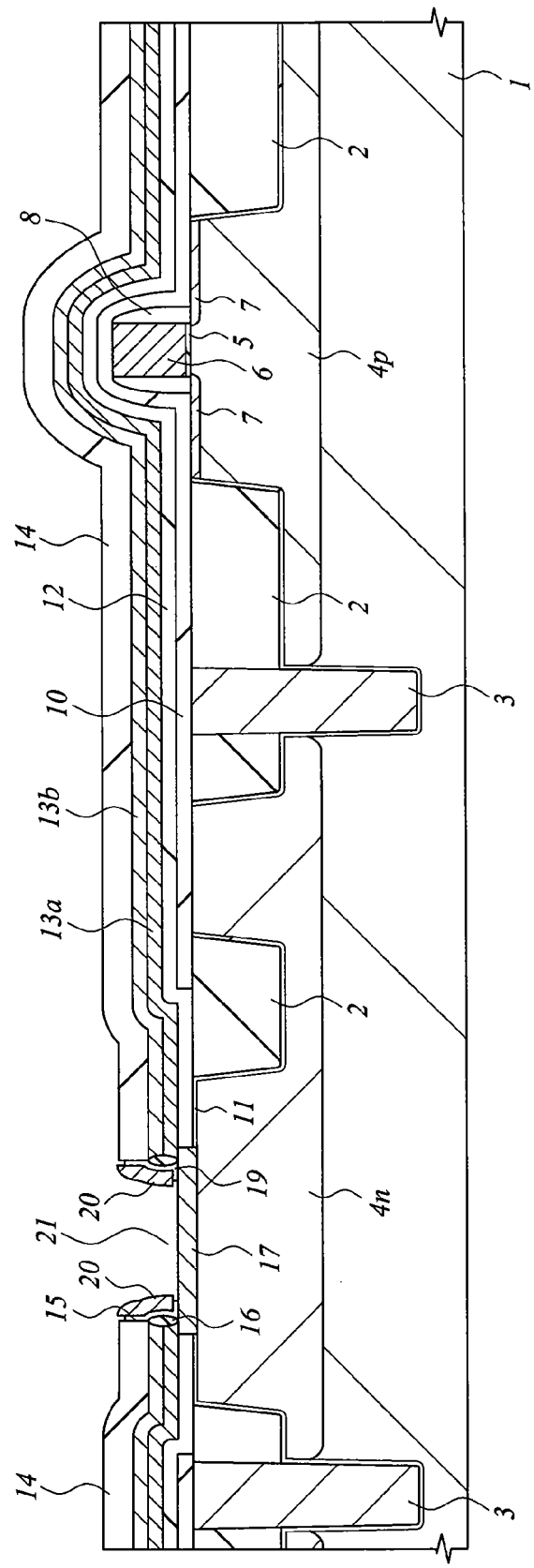
FIG. 11 is a cross-sectional view of a principal part of a semiconductor substrate showing a method for manufacturing a semiconductor device continued from FIG. 10.

Next, as shown in FIG. 10, the anisotropic dry etching is performed to the n-type polysilicon film 20$n$, thereby forming side wall spacers 20 on the side walls of the emitter opening 15. Thereafter, as shown in FIG. 11, the silicon dioxide film 19 is removed by wet etching using a diluted hydrofluoric acid, thereby forming an intrinsic emitter opening 21.

Figure 12:
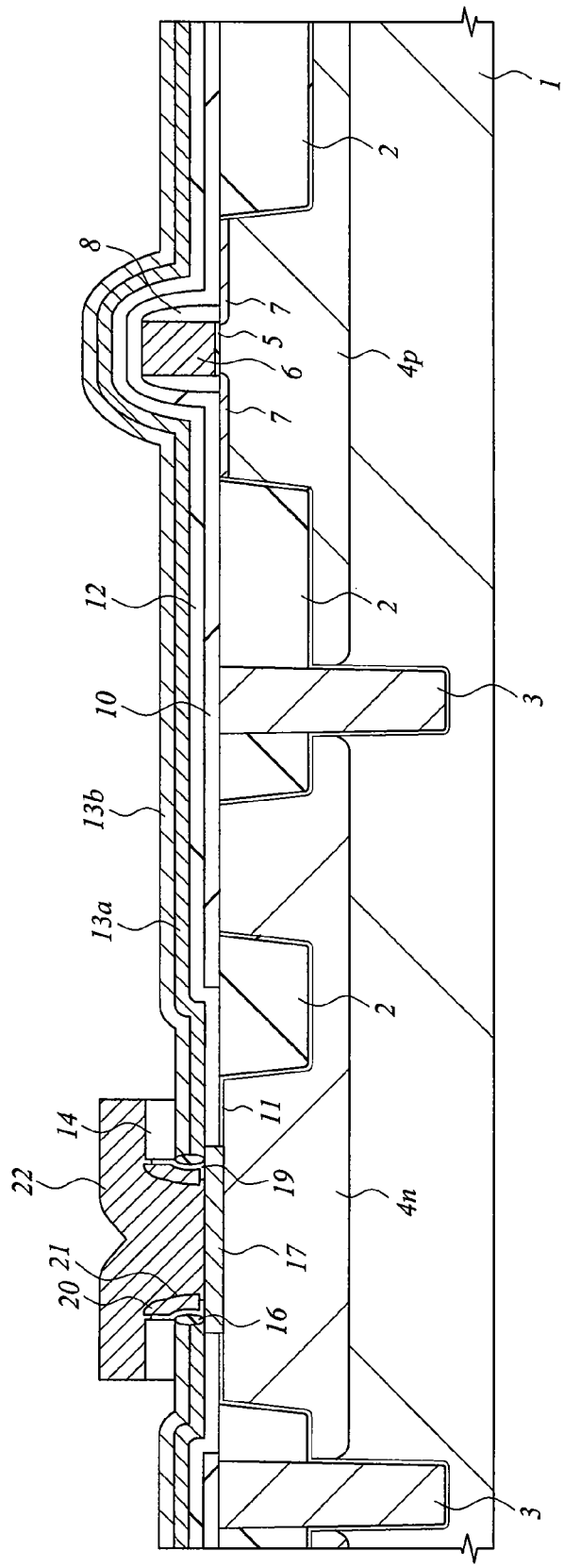
FIG. 12 is a cross-sectional view of a principal part of a semiconductor substrate showing a method for manufacturing a semiconductor device continued from FIG. 11.

Next, as shown in FIG. 12, after an n-type polysilicon film is deposited over the substrate 1 by a CVD method, dry etching is performed to both the n-type polysilicon film and its underlying silicon dioxide film 14, whereby an external emitter electrode 22 is formed on the boron doped SiGe epitaxial film 17 which is exposed at the bottom of the intrinsic emitter opening 21.

Figure 13:
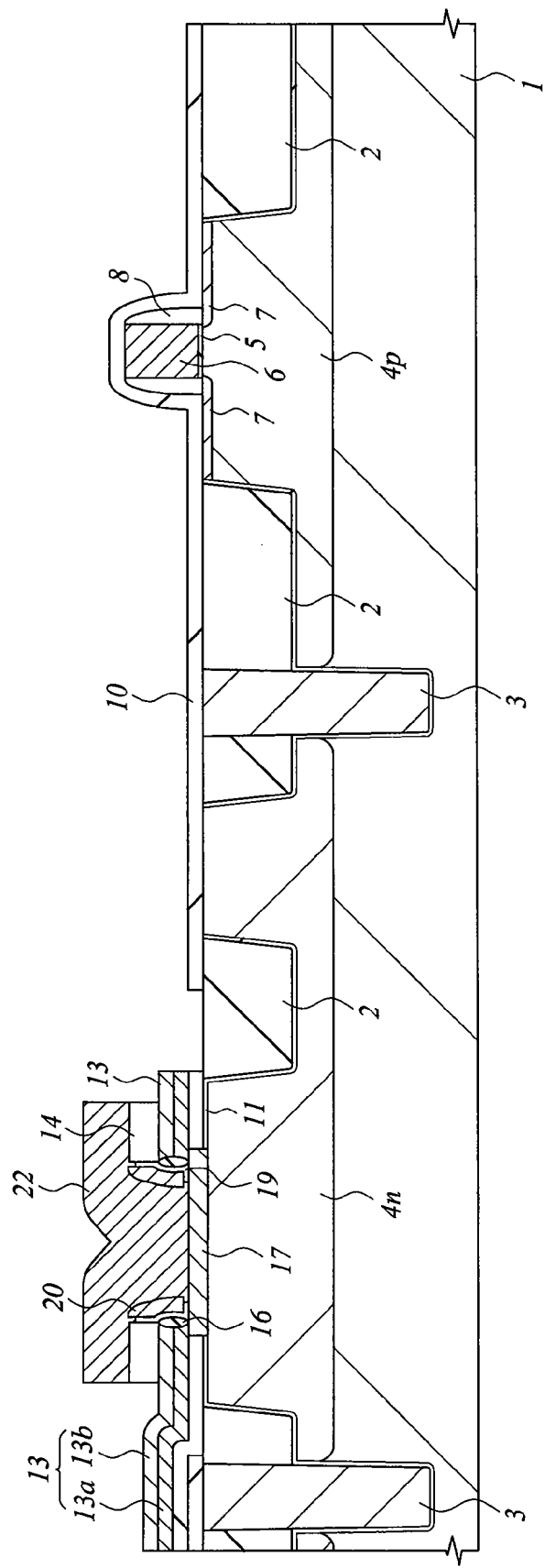
FIG. 13 is a cross-sectional view of a principal part of a semiconductor substrate showing a method for manufacturing a semiconductor device continued from FIG. 12.

Next, as shown in FIG. 13, dry etching is performed to the two layers, that is, the p-type polysilicon films 13$a$ and 13$b$ each having different dopant concentration and their underlying silicon nitride film 12, whereby an external base electrode 13 constituted of the p-type polysilicon films 13$a$ and 13$b$ is formed.

In the present embodiment described above, the p-type polysilicon film 13$b$ doped with a medium concentration of boron is laminated on the p-type polysilicon film 13$a$ doped with a high concentration of boron, and then, the two layers of the p-type polysilicon films 13$a$ and 13$b$ are patterned, thereby forming the external base electrode 13. Therefore, the p-type polysilicon film 13$a$ doped with a high concentration of boron is in contact with the boron doped SiGe epitaxial film 17 at the junction portion between the external base electrode 13 and the boron doped SiGe epitaxial film 17.

Figure 14:
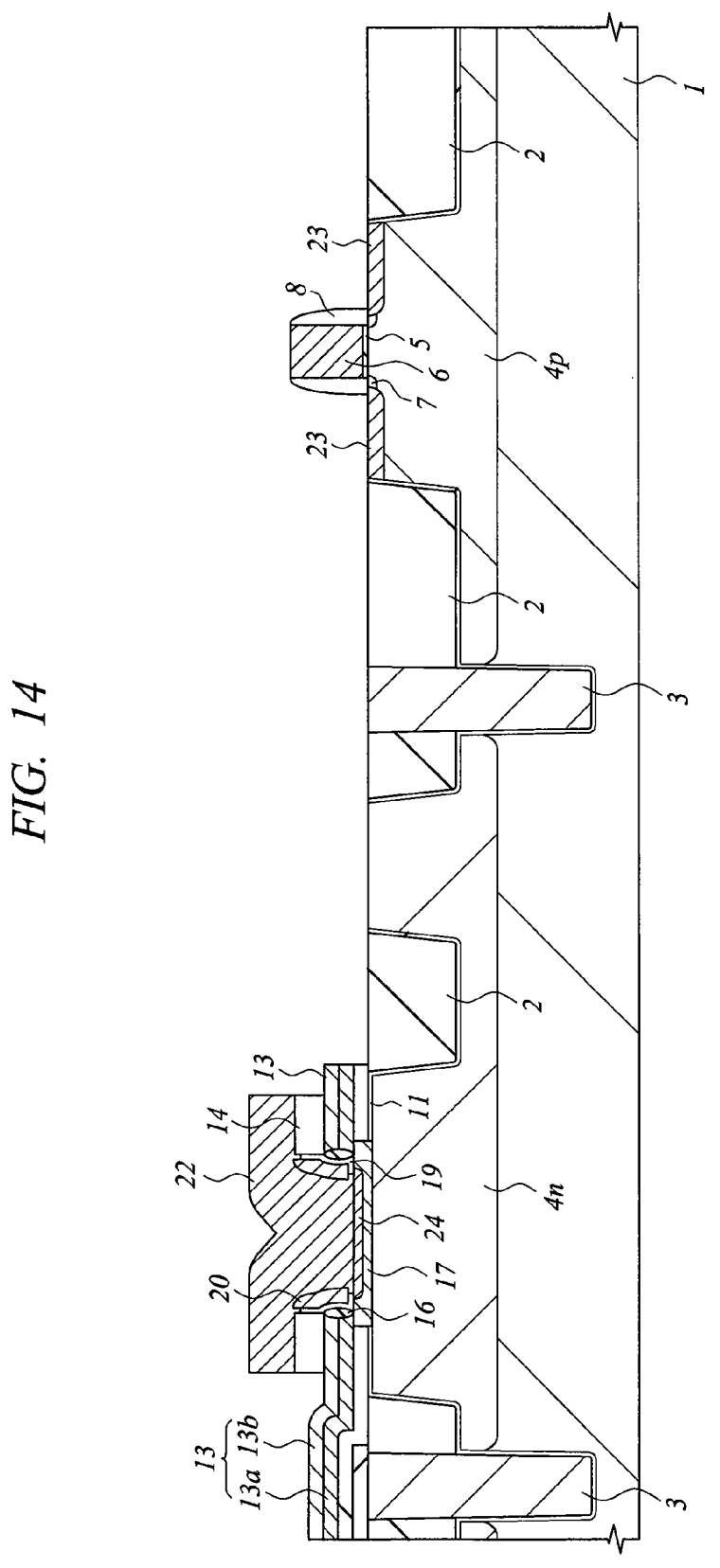

Next, as shown in FIG. 14, after the silicon dioxide 10 remaining in the MOS transistor formation region is removed by dry etching, phosphorus is ion-implanted into the p-type well 4$p$. Then, the substrate 1 is subjected to annealing to activate the phosphorus, thereby forming $n^+$-type semiconductor regions 23 (source, drain). Through the process as described above, the nMOS transistor is completed. In addition, the above-mentioned anneal makes the phosphorus in the external emitter electrode 22 diffuse in a part of the boron doped SiGe epitaxial film 17, and an n-type emitter layer 24 is formed. Through the process as described above, the HBT is completed.

Figure 15:
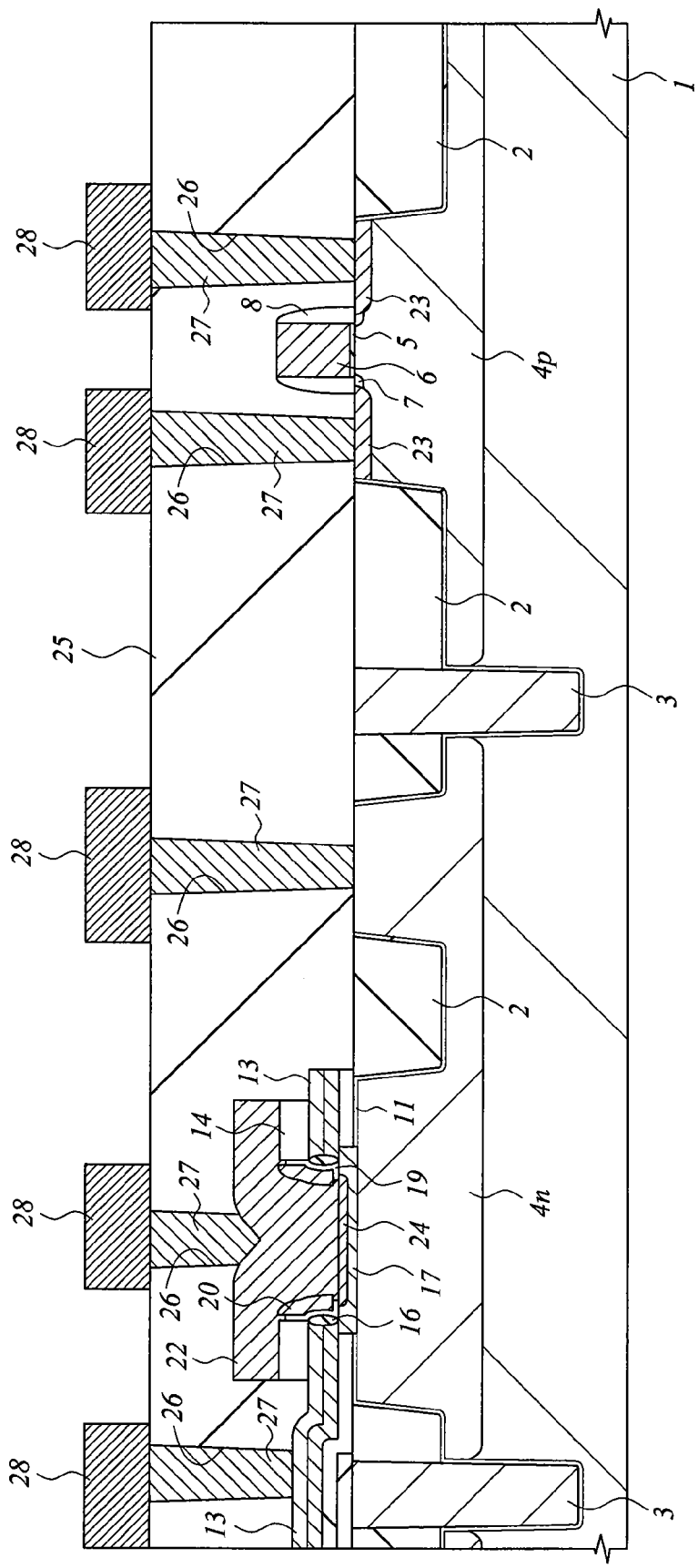
FIG. 15 is a cross-sectional view of a principal part of a semiconductor substrate showing a method for manufacturing a semiconductor device continued from FIG. 14.

Next, as shown in FIG. 15, a thick silicon dioxide film 25 is deposited over the substrate 1 by a CVD method, and then, a contact hole 26 is formed by dry etching of a part of the silicon dioxide film 25. Thereafter, a plug 27 made of a tungsten film or the others is formed in the contact hole 26. Then, an aluminum alloy film deposited on the silicon dioxide film 25 by a sputtering method is dry-etched, whereby a metal wire 28 is formed. In addition, prior to the step of depositing the silicon dioxide film 25, cobalt silicide layers (not shown) are formed on the surfaces of conductive layers (n-type collector layer 4n, external base electrode 13, external emitter electrode 22, and n+-type semiconductor region 23) at the bottom of the contact holes 26 by a conventional method. By this means, the contact resistances between these conductive layers and the plugs 27 can be reduced.

Figure 16:
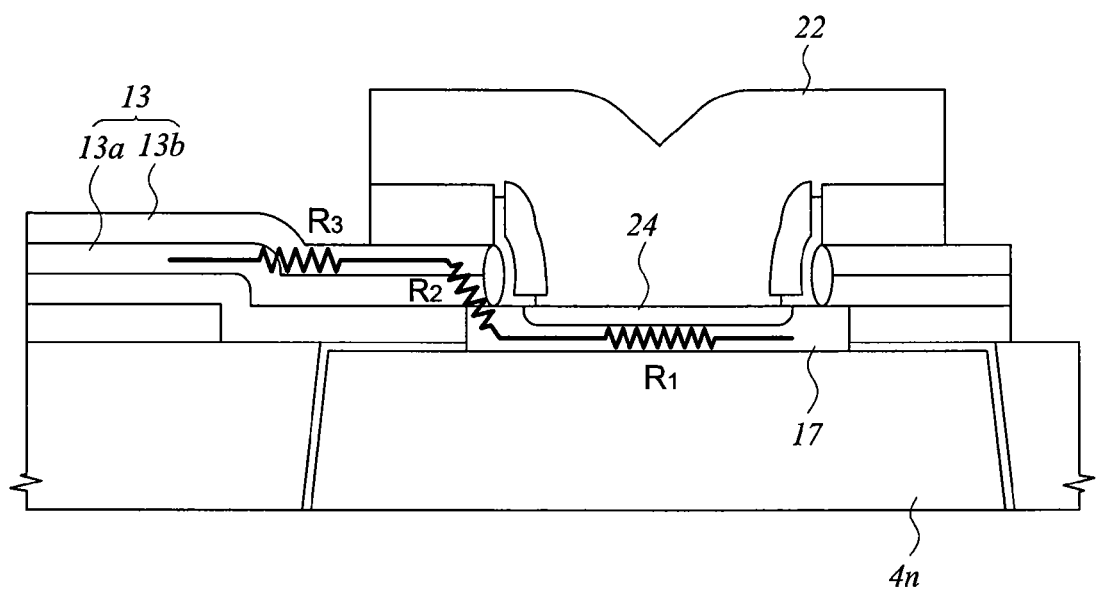
FIG. 16 is an explanatory view showing elements of base resistance.

An effect of the HBT manufactured by the above-described method will be described below. FIG. 16 is an explanatory view showing elements of base resistance (Rb). As shown in FIG. 16, the elements constituting the base resistance (Rb) are separated into the resistance ($R_1$) of an intrinsic base layer (boron doped SiGe epitaxial film 17), the resistance ($R_2$) of the junction portion between the intrinsic base layer and the external base electrode 13, and the resistance ($R_3$) of the external base electrode 13.

Figure 17:
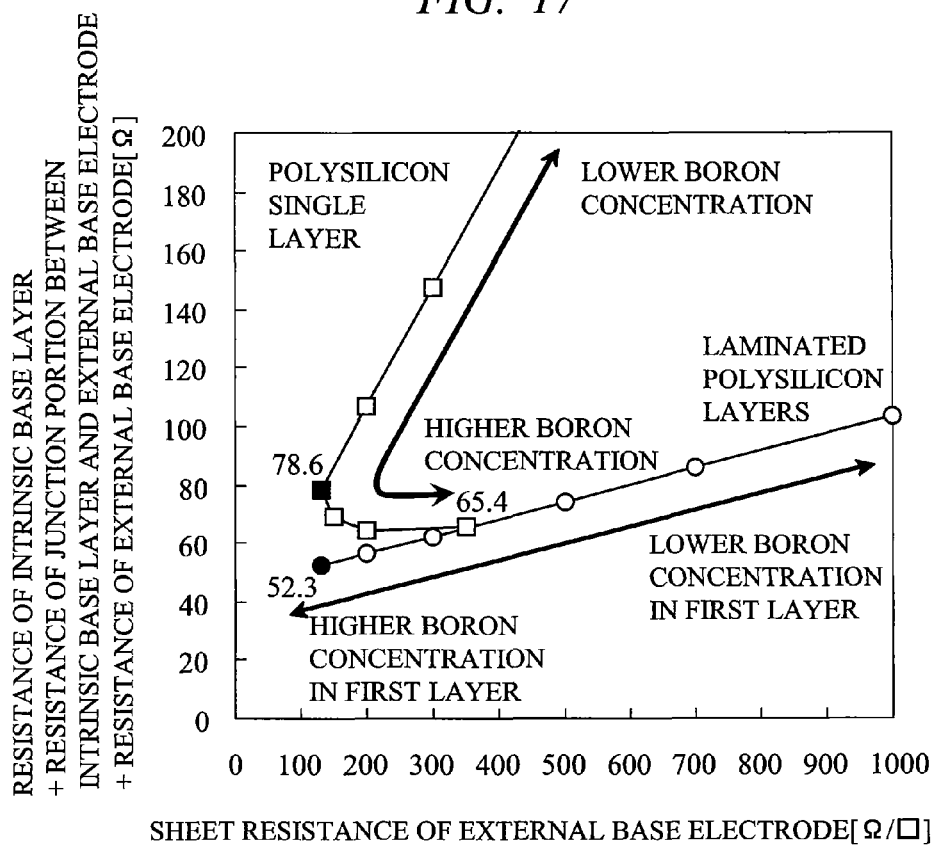
FIG. 17 is a graph showing effects of the present invention.

FIG. 17 is a graph showing an effect obtained by forming the external base electrode 13 from the above-mentioned two layers of p-type polysilicon films 13a and 13b. The horizontal axis of the graph represents a sheet resistance [Ω/□]. The vertical axis of the graph represents a total resistance [Ω] of the resistant ($R_1$) of the intrinsic base layer, the resistance ($R_2$) of the junction portion where the intrinsic base layer contacts with the external base electrode 13, and the resistance ($R_3$) of the external base electrode 13.

The external base electrode 13 according to the present embodiment has a two-layered structure in which the p-type polysilicon layer 13b doped with a medium concentration of boron (from $1 \times 10^{21}$ atoms/cm$^3$ to less than $2 \times 10^{21}$ atoms/cm$^3$) is laminated on the p-type polysilicon layer 13a doped with a high concentration of boron ($2 \times 10^{21}$ atoms/cm$^3$ or more).

Therefore, at the junction where the external base electrode 13 contacts with the intrinsic base layer, a structure in which the p-type polysilicon film 13a doped with a high concentration of boron is in contact with the intrinsic base layer is realized. Accordingly, the resistance ($R_2$) of the junction portion can be sufficiently reduced.

Figure 19:
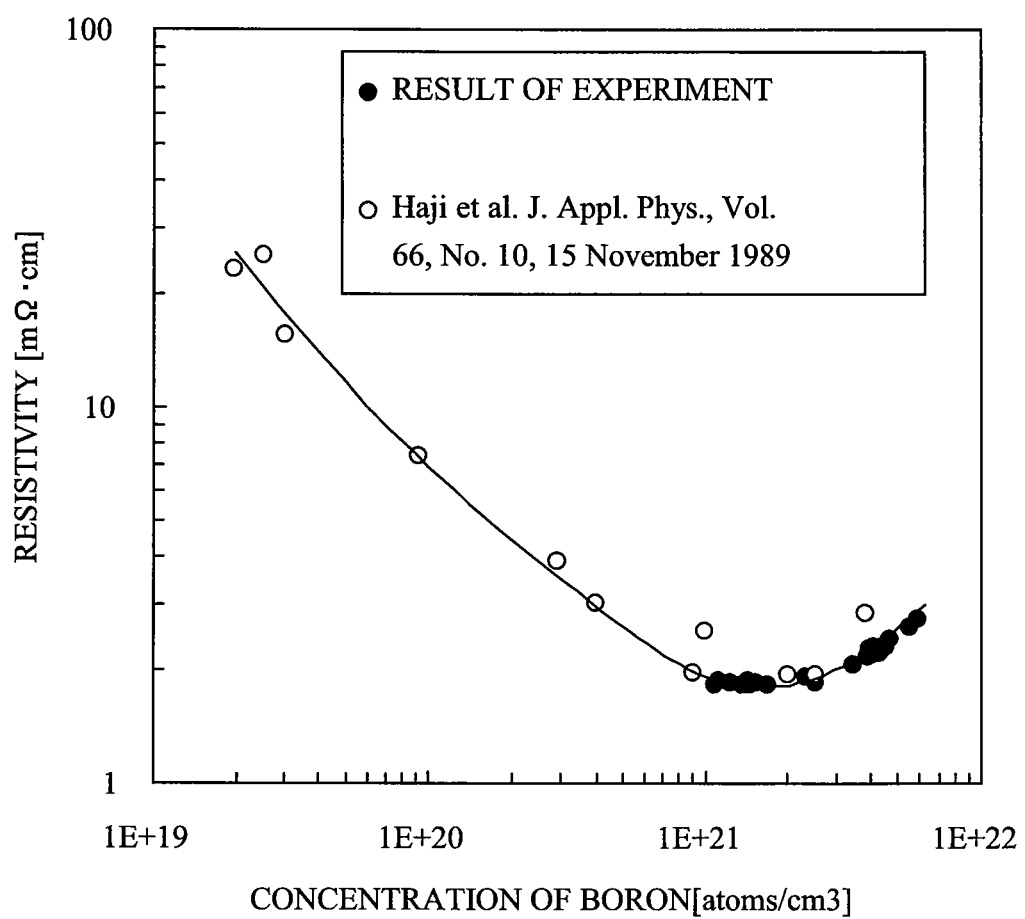
FIG. 19 is a graph showing the result of experiment on the measurement of the relationship between the resistivity of a born doped polysilicon film and the boron concentration in the film.

Furthermore, since the resistance ($R_3$) of the external base electrode 13 becomes a parallel resistance of the resistance of the p-type polysilicon film 13a and the resistance of the p-type polysilicon film 13b, the resistance of the p-type polysilicon film 13b whose boron concentration is relatively lower is dominant. For this reason, the resistance ($R_3$) of the external base electrode 13 becomes almost the same resistance as that of a single p-type polysilicon film doped with a medium concentration of boron (from $1 \times 10^{21}$ atoms/cm$^3$ to less than $2 \times 10^{21}$ atoms/cm$^3$) and can be sufficiently reduced as shown in FIG. 19.

As described above, according to the present embodiment, since both the resistance ($R_2$) of the junction portion between the external base electrode and the base layer and the resistance ($R_3$) of the external base electrode 13 can be reduced at the same time, the base resistance (Rb) can be reduced and a high speed performance of the HBT can be improved.

In the foregoing, the invention made by the inventors of the present invention has been concretely described based on the embodiments. However, it is needless to say that the present invention is not limited to the foregoing embodiments and various modifications and alterations can be made within the scope of the present invention.

Figure 18:
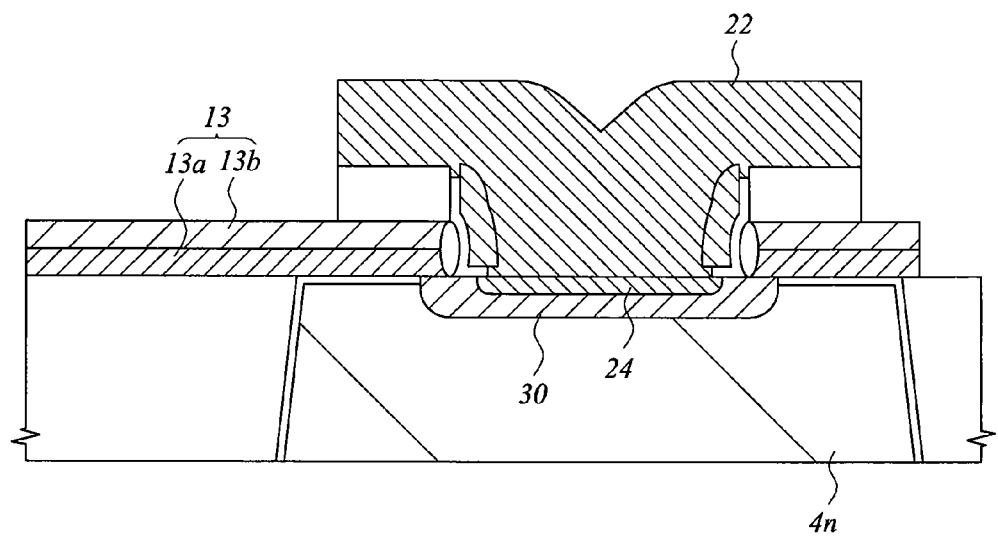
FIG. 18 is a cross-sectional view of a principal part of a semiconductor substrate showing a method for manufacturing a semiconductor device according to another embodiment of the present invention.

The above-described embodiment is applied to a manufacture of a semiconductor having an HBT using SiGe. However, the present invention can be applied to a manufacture of a conventional bipolar transistor. For example, it can be applied to a manufacture of a homojunction bipolar transistor comprising a base layer 30 formed by boron ion implantation into a part of the surface of n-type collector layer 4n as shown in FIG. 18.

Also, the present invention can be applied to an HBT using a heterojunction material different from SiGe. Accordingly, boron concentrations in two silicon films constituting an external base electrode are not limited to the concentration ranges described in the embodiments and can be changed depending on a characteristic of a bipolar transistor.

The present invention can be applied to a semiconductor device having a bipolar transistor.

What is claimed is:

1. A semiconductor device having a bipolar transistor, the bipolar transistor comprising:
    an n-type collector layer formed on a main surface of a semiconductor substrate;
    a p-type base layer formed on the n-type collector layer;
    an external base electrode connected to the p-type base layer; and
    an n-type emitter layer,
    wherein the external base electrode has a multilayered structure in which a second silicon film having a second boron concentration is laminated on a first silicon film having a first boron concentration, and the second boron concentration is lower than the first boron concentration,
    wherein the external base electrode and the p-type base layer are disposed so that the first silicon film is in contact with the p-type base layer, and
    wherein the boron concentration of the first silicon film is $2 \times 10^{21}$ atoms/cm$^3$ or more, and the boron concentration of the second silicon film is in a range from $1 \times 10^{21}$ atoms/cm$^3$ to less than $2 \times 10^{21}$ atoms/cm$^3$.

2. The semiconductor device according to claim 1,
    wherein the p-type base layer is made of a boron doped heterojunction material.

3. The semiconductor device according to claim 2,
    wherein the heterojunction material is SiGe.

4. The semiconductor device according to claim 1,
    wherein the external base electrode and the p-type base layer are disposed so that one end of the external base electrode is in contact with an outer peripheral portion of the p-type base layer.

5. The semiconductor device according to claim 1,
    wherein the n-type emitter layer is formed on a part of the surface of the p-type base layer, and an external emitter electrode separated from the external base electrode by an insulating film is connected to the n-type emitter layer.

6. A method for manufacturing a semiconductor device, comprising the steps of:
    (a) forming an n-type collector layer on a main surface of a semiconductor substrate;
    (b) forming a p-type base layer on the n-type collector layer;

(c) after the step (b), forming a first silicon film having a first boron concentration over the main surface of the semiconductor substrate, and laminating a second silicon film having a second boron concentration which is lower than the first boron concentration on the first silicon film; and (d) patterning the first and second silicon films, thereby forming an external base electrode including the first and second silicon films and having a part of the first silicon film being in contact with the p-type base layer, wherein the boron concentration of the first silicon film is $2\times10^{21}$ atoms/cm$^3$ or more, and the boron concentration of the second silicon film is in a range from $1\times10^{21}$ atoms/cm$^3$ to less than $2\times10^{21}$ atoms/cm$^3$.

7. The method for manufacturing a semiconductor device according to claim 6,
wherein the first and second silicon films are formed by a CVD method in which boron is doped during formation of the film.

8. The method for manufacturing a semiconductor device according to claim 6,
wherein the p-type base layer is formed by depositing a thin film made of a boron doped heterojunction material on the n-type collector layer.

9. The method for manufacturing a semiconductor device according to claim 7,
wherein the heterojunction material is SiGe.

10. The method for manufacturing a semiconductor device according to claim 6,
wherein the p-type base layer is formed by ion-implanting boron into a part of the surface of the n-type collector layer.

11. The method for manufacturing a semiconductor device according to claim 6,
wherein the external base electrode and the p-type base layer are disposed so that one end of the external base electrode is in contact with an outer peripheral portion of the p-type base layer.

12. The method for manufacturing a semiconductor device according to claim 6, further comprising the steps of, after the step (d):

(e) forming an external emitter electrode made of an n-type silicon film separated from the external base electrode by an insulating film on a part of the surface of the p-type base layer; and (f) forming an n-type emitter layer on a part of the surface of the p-type base layer by diffusing an n-type dopant from the n-type silicon film constituting the external emitter electrode into a part of the surface of the p-type base layer.

13. The semiconductor device according to claim 1,
wherein a resistance at a junction formed by said first silicon film and said p-type base layer, and a resistance of said external base electrode, are both less than a resistance of said p-type base layer.

* * * * *